United States Patent
Kim et al.

(10) Patent No.: US 9,312,183 B1
(45) Date of Patent: Apr. 12, 2016

(54) METHODS FOR FORMING FINFETS HAVING A CAPPING LAYER FOR REDUCING PUNCH THROUGH LEAKAGE

(71) Applicant: GLOBALFOUNDRIES Inc., Grand Cayman (KY)

(72) Inventors: Hoon Kim, Clifton Park, NY (US); Min Gyu Sung, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/531,743

(22) Filed: Nov. 3, 2014

(51) Int. Cl.
   *H01L 21/336* (2006.01)
   *H01L 21/8234* (2006.01)
   *H01L 27/088* (2006.01)

(52) U.S. Cl.
   CPC ...... *H01L 21/823437* (2013.01); *H01L 21/823431* (2013.01); *H01L 27/0886* (2013.01)

(58) Field of Classification Search
   CPC ............. H01L 29/41791; H01L 29/42392; H01L 29/785; H01L 29/78609
   See application file for complete search history.

(56) References Cited

U.S. PATENT DOCUMENTS

| 8,193,524 B2 | 6/2012 | Bjoerk et al. | |
| 2010/0072460 A1 | 3/2010 | Bjoerk et al. | |
| 2014/0027816 A1* | 1/2014 | Cea | H01L 29/66545 257/192 |
| 2015/0137263 A1* | 5/2015 | Lee | H01L 29/0642 257/401 |

OTHER PUBLICATIONS

Akarvardar et al., "FinFET With Insulator Under Channel", U.S. Appl. No. 13/945,627, filed Jul. 18, 2013, 26 pages.

* cited by examiner

*Primary Examiner* — Thanh Y Tran
(74) *Attorney, Agent, or Firm* — Heslin Rothenberg Farley and Mesiti PC; Nicholas Mesiti

(57) ABSTRACT

A method for forming FinFETs having a capping layer for reducing punch through leakage includes providing an intermediate semiconductor structure having a semiconductor substrate and a fin disposed on the semiconductor substrate. A capping layer is disposed over the fin, and an isolation fill is disposed over the capping layer. A portion of the isolation fill and the capping layer is removed to expose an upper surface portion of the fin. Tapping layer and a lower portion of the fin define an interface dipole layer barrier, a portion of the capping layer operable to provide an increased negative charge or an increased positive charge adjacent to the fin, to reduce punch-through leakage compared to a fin without the capping layer.

14 Claims, 9 Drawing Sheets

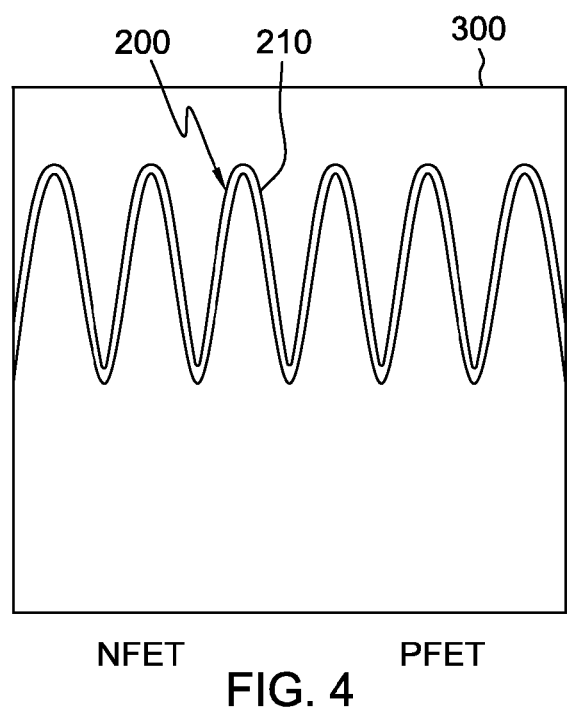
NFET   FIG. 4   PFET
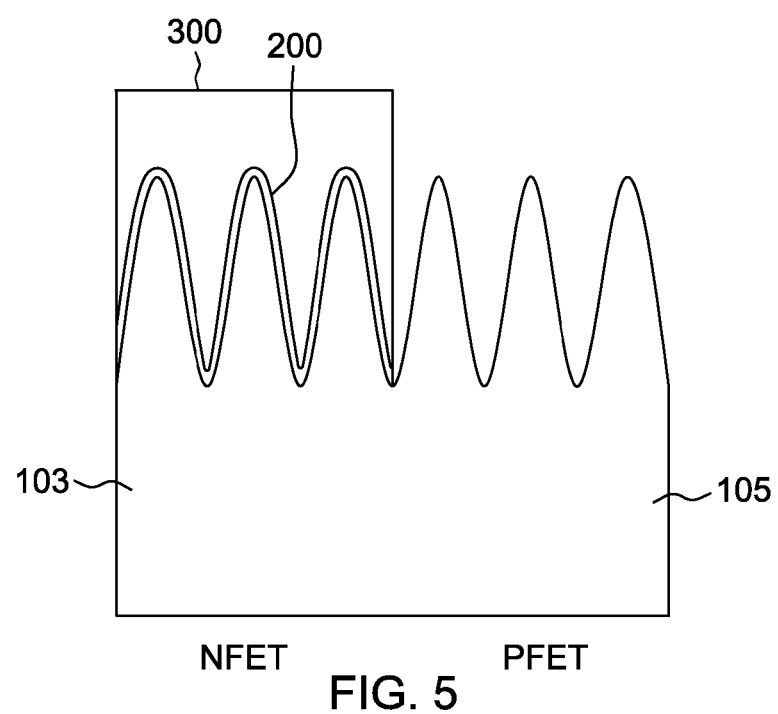
NFET   FIG. 5   PFET

METHODS FOR FORMING FINFETS HAVING A CAPPING LAYER FOR REDUCING PUNCH THROUGH LEAKAGE

TECHNICAL FIELD

The present disclosure relates generally to conductive circuits and methods of forming conductive circuits, and more particularly, a capping treatment of a fin in the fabrication of a FinFET structure to reduce punch-through leakage.

BACKGROUND OF THE DISCLOSURE

Fin field-effect transistors (FinFET) devices have been developed to replace conventional planar bulk MOSFETs in advanced CMOS technology due to their improved short-channel effect immunity and $I_{on}/I_{off}$ ratio. However, a problem with bulk short channel FinFET devices, is that a leakage path from source to drain exists through a portion of the fin not covered by the gate, but lies below the channel. The leakage of current from source to drain through the lower (un-gated) part of the fin that is not covered by the gate, commonly known as punch-through leakage, causes an increase of static power consumption which is undesirable in modern submicron devices.

In one solution, punch-through leakage in submicron semiconductor devices is sought to be controlled by implanting a punch-through-stopper (PTS) dopant in a portion of the fin directly below the channel. However, the impurities doped by the punch-through-stopper (PTS) implantation may diffuse into the channel region, increasing the variability due to random dopant fluctuation (RDF) and lowering the carrier mobility of the channel region.

There is a need for improved methods for forming FinFETs with reduce punch-through leakage.

SUMMARY OF THE DISCLOSURE

The shortcomings of the prior art are overcome and additional advantages are provided through the provision, in one aspect, of a method which includes, for instance, providing an intermediate semiconductor structure having a semiconductor substrate and a fin disposed on the semiconductor substrate, providing a capping layer disposed over the fin, providing an isolation fill disposed over the capping layer, and removing a portion of the isolation fill and the capping layer to expose an upper surface portion of the fin. The capping layer and a lower portion of the fin define an interface dipole layer barrier, a portion of the capping layer operable to provide an increased negative charge or an increased positive charge adjacent to the fin, to reduce punch-through leakage compared to a fin without the capping layer.

In another aspect, a method includes providing a semiconductor substrate and a plurality of fins disposed on the semiconductor substrate, providing a first capping layer disposed over the fins, and a first isolation fill disposed over the first capping layer. A portion of the capping layer and the first isolation fill is removed to expose some of the fins. A second capping layer is disposed over the exposed fins, and a second isolation fill over the second capping layer. The second capping layer is different from the first capping layer. A portion of the first and second capping layers and the first and second isolation fills are removed to expose upper surface portions of the fins. The capping layers and the lower portions of the fins define interface dipole layer barriers. Portions of the capping layers are operable to provide increased negative charges or increased positive charges adjacent to the fins, to reduce punch-through leakage compared to fins not having the capping layers.

In another aspect, a semiconductor structure includes a semiconductor substrate, and a fin disposed on said substrate having an upper portion and a lower portion. A capping layer is disposed over a lower surface portion of the fin and an isolation fill is disposed over the capping layer. The capping layer and a lower portion of the fin define an interface dipole layer barrier to reduce punch-through leakage compared to a fin without the capping layer. A portion of the capping layer operable to provide an increased negative charge or an increased positive charge adjacent to the fin, Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

FIGS. 2-8 are cross-sectional views illustrating an embodiment of a method employing a capping layer treatment of a fin during fabrication of an intermediate semiconductor structure in accordance with aspects of the present disclosure;

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure.

Reference is made below to the drawings, which are not drawn to scale for ease of understanding, wherein the same reference numbers used throughout different figures designate the same or similar components.

The present disclosure addresses, inter alia, punch-through leakage in a FinFET, and more specifically, to use of a capping layer during semiconductor fabrication. For example, the technique of the present disclosure may include after forming a fin, forming a capping layer over upper and lower portions of the fin and an isolation fill over the capped fin. A portion of the isolation fill and the dielectric capping layer are removed to expose the upper portion of the fin which is then covered by a gate. In some embodiments, for example, the capping layer may result in a charge formation. For example, the capping layer may provide a negative charge for use in connection with NFETs, or a positive charge for use in connection with PFETs. With such semiconductor devices, performance of a FinFET may be improved. For example, the present technique results in the formation of a dipole at the interface of the capping layer and fin that forms a barrier to inhibit punch through leakage.

Figure 1:
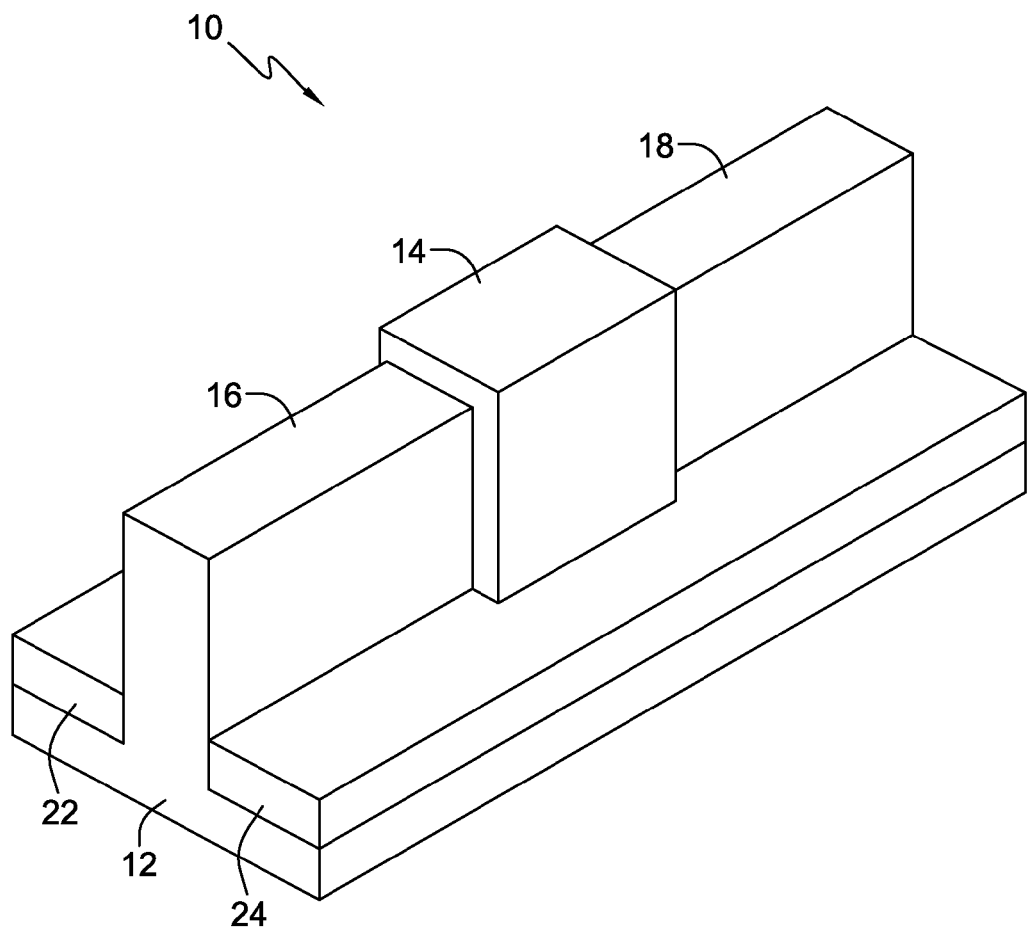
FIG. 1 is a perspective view of an embodiment of a semiconductor structure employing a capping layer treatment of a fin during fabrication in accordance with aspects of the present disclosure.

FIG. 1 illustrates one embodiment of a FinFET (field effect transistor) semiconductor structure 10 fabricated and operable in accordance with one or more aspects of the present disclosure. For example, the illustrated intermediate structure 10 may generally include a substrate 12, a gate 14, a source 16, and a drain 18, and isolation layers 22 and 24. It will be understood that the positioning of the source and drain areas could be switched. The basic structure of a field effect transistor is typically formed by forming various layers of material and thereafter patterning those layers of material using known photolithography and etching processes.

Figure 2:
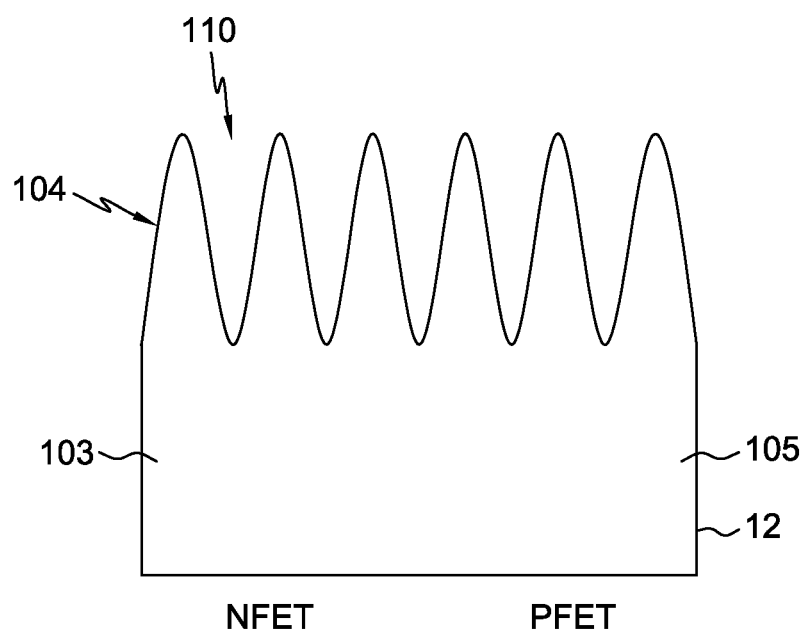

FIGS. 2-8 illustrate one embodiment of a process for fabricating an intermediate semiconductor structure 100 (FIG. 8) for use in forming a FinFET semiconductor structure 10 (FIG. 1) in accordance with aspects of the present disclosure. With reference to FIG. 2, in this example, an intermediate structure includes a substrate 12, such as a semiconductor substrate having formed thereon a plurality of fins 104 extending therefrom.

The substrate may be, for example, a bulk semiconductor material such as a bulk silicon wafer. As another example, the substrate may be or include any silicon-containing substrate including, but not limited to, silicon (Si), single crystal Si, crystalline Si, amorphous Si, silicon-on-nothing (SON), silicon-on-insulator (SOI), or silicon-on-replacement insulator (SRI) or the like. Other material may include silicon-germanium (SiGe), or pure germanium (Ge). Still other materials for the fin may be suitably employed.

The fins may be formed by removing one or more portions of the substrate, creating openings 110 therein, and thereby creating one or more fins 104 from the same material as the substrate, such as, for example, a silicon semiconductor material. In one example, formation of fins 104 may be achieved by patterning a protective material or layer (not shown) disposed on substrate 102 using any of various approaches, including: direct lithography; sidewall image transfer technique; extreme ultraviolet technique (EUV); e-beam technique; litho-etch litho-etch; or litho-etch litho-freeze. Following patterning, the removal may be performed, for example, by any suitable etching process, such as an anisotropic dry etching process, for instance, reactive-ion-etching (RIE) in sulfur hexafluoride ($SF_6$). In one embodiment, the protective material or layer may be or include a nitride material such as, for instance, silicon nitride (SiN or $Si_3N_4$) or silicon oxynitride (SiON). By way of specific example, a protective material or layer may be deposited over the silicon substrate using any conventional deposition processes such as chemical vapor deposition (CVD), physical vapor deposition (PVD), atomic layer deposition (ALD) or plasma-enhanced versions of such processes. The protective material may be provided to protect the underlying silicon substrate from damage during subsequent etch processes, and depending on the fabrication process, may also prevent the silicon substrate from being oxidized by exposure to an oxygen-containing environment during device fabrication.

With reference still to FIG. 2, various doped regions such as an NFET region 103 and a PFET region 105 may be formed by performing one or more ion implantation processes through a patterned mask layer using an appropriate dopant material, e.g., an N-type dopant or a P-type dopant, to implant the desired dopant material into the substrate. The particular dopant selected depends on the specific implant region being formed and the type of device under construction, i.e., an NFET transistor or a PFET transistor. During the fabrication of complex integrated circuits millions of transistors, e.g., NFET transistors and/or PFET transistors are formed on a substrate by performing a number of process operations.

Figure 3:
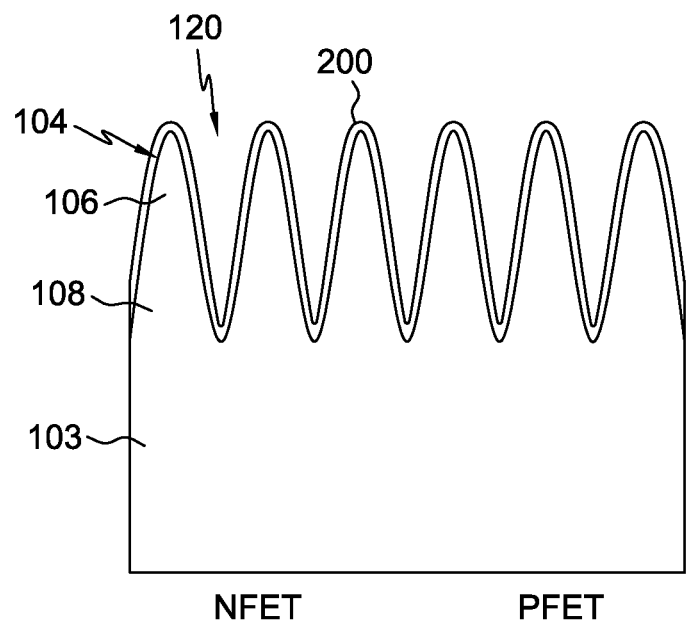

FIG. 3 illustrates the structure of FIG. 2 in which a first capping layer 200 is disposed over fins 104. For example, the first capping layer 200 may be disposed over upper surface portions 106 and lower surface portions 108 of fins 104 disposed over the NFET region and the PFET region. The first capping layer may allow for forming a negative charge formation in the fin over the NFET region as explained in greater detail below. For example, the capping layer 200 may have a thickness of about 0.1 angstrom to about 20 angstroms, and desirably about 5 angstroms. The first capping layer may be formed by atomic layer deposition (ALD) or chemical vapor deposition (CVD). In other embodiments, the first capping layer may be formed employing plasma doping (such as doping on top of a dielectric) or other conformal deposition methods. The capping layer may be an oxide material such as an aluminum oxide (Al2O3) layer disposed over upper portions 106 and lower portions 108 of fins 104 disposed over NFET region 103.

As shown in FIG. 4, an isolation fill material 300 may be disposed over an outer surface 210 of first capping layer 200. For example, spaces 120 (FIG. 3) disposed between fins 104 having first capping layer 200 may be filed with isolation fill material 300. The isolation material may extend above the upper distal ends of the fins.

A patterning and removal of a portion of isolation material 300 and first capping layer 200 is performed resulting in the intermediate structure shown in FIG. 5. For example, portions of the isolation material and first capping layer disposed over PFET region 105 may be removed, so that the remaining portions of the isolation material 300 and first dielectric capping layer 200 remains disposed over the NFET region 103.

Figure 6:
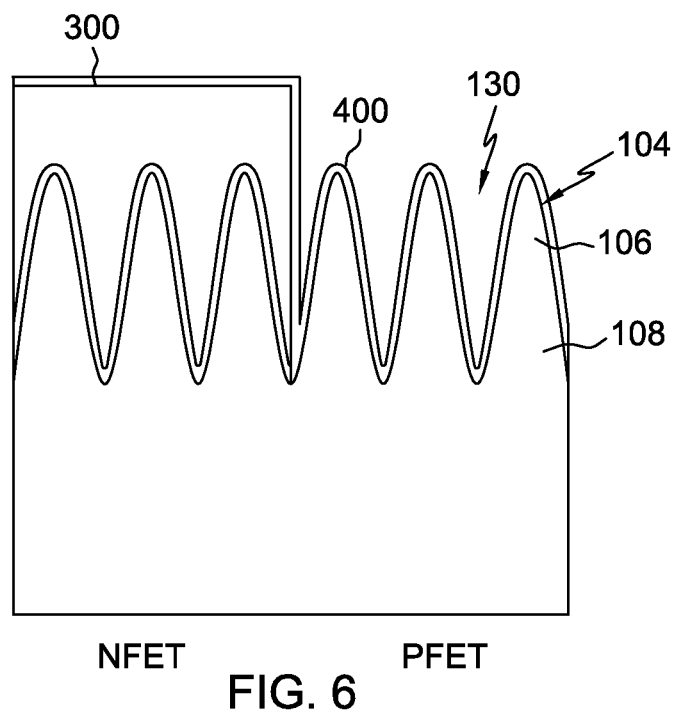

FIG. 6 illustrates the structure of FIG. 5 in which a second capping layer 400 is disposed over upper surface portions 106 and lower surface portions 108 of the exposed fins 104 and over the remaining patterned isolation fill 300. The second capping layer 400 may allow for forming a positive charge formation in the fin over the PFET region as explained in greater detail below. For example, the capping layer 400 may have a thickness of about 0.1 angstrom to about 20 angstroms, and desirably about 5 angstroms. The second capping layer may be formed by atomic layer deposition (ALD), or chemical vapor deposition (CVD). In other embodiments, the second capping layer may be formed employing plasma doping (such as doping on top of a dielectric) or other conformal deposition methods. The dielectric capping layer may be an oxide such as a lanthanum oxide (La2O3) layer disposed over upper portions 106 and lower portions 108 of fins 104 disposed over PFET region 105.

Figure 7:
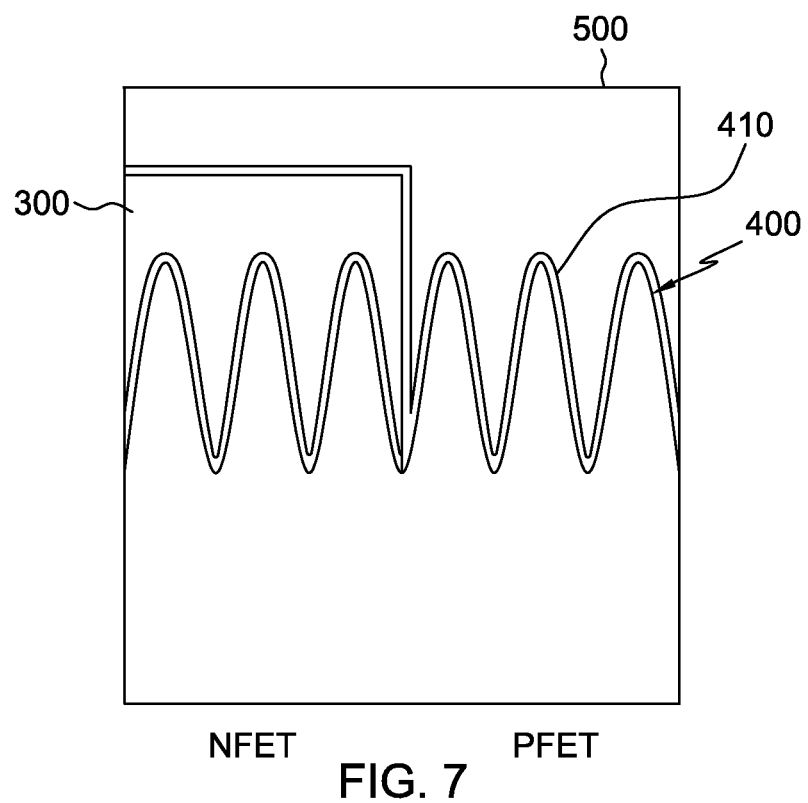

As shown in FIG. 7, an isolation fill material 500 may be disposed over an outer surface 410 of second capping layer 400. For example, spaces 130 (FIG. 3) disposed between fins 104 having second dielectric capping layer 400 may be filed with isolation fill material 500. The isolation material may extend above the upper distal ends of the fins and an upper surface of isolation material 300.

The isolation materials, in one example, may be or include a dielectric material or other material, and may be deposited using a variety of techniques such as, for example, chemical vapor deposition (CVD), plasma-enhanced CVD or sub-atmospheric pressure thermal CVD (SACVD) processes. The thickness of the isolation materials may be (in one example) sufficient to allow, as described below, subsequent planarization of the structure, for instance, to expose an upper surface portion the fins. By way of example, the isolation materials may be fabricated of or include an oxide material such as silicon dioxide (SiO2). For instance, high-density plasma (HDP) oxide, high aspect ratio process (HARP) oxide or tetraethyl orthosilicate (TEOS)-based silicon dioxide may be deposited as an isolation material using, for example, a plasma-enhanced CVD process. As a specific example, a chemical vapor deposition process may be employed using tetraethyl orthosilicate (TEOS) and ozone ($O_3$) as reactants to deposit a tetraethyl orthosilicate based silicon dioxide isolation material in the space between adjacent fins, which will serve to electrically isolate the resultant fin-type field effect transistors.

Figure 8:
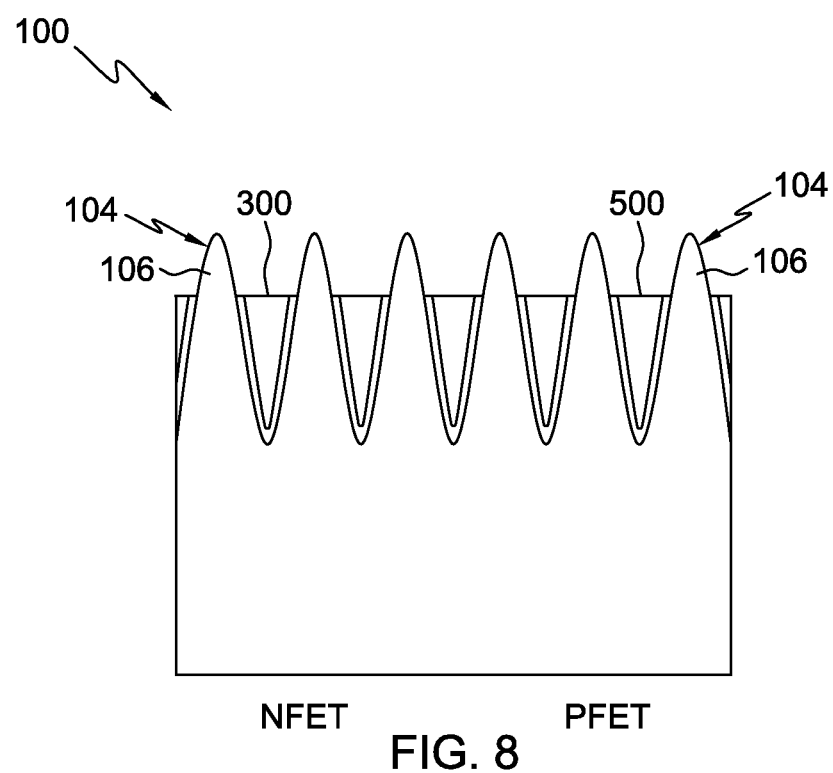

With reference to FIG. 8, one or more etch processes may be performed to recess isolation materials 300 and 500, remove portions of patterned capping layers 200 and 400, and expose upper surface portions 106 of fins 104.

By way of example, isolation materials 300 and 500 and first and second capping layers 200 and 400 may be selectively etched using conventional isotropic or anisotropic dry etching processes such as, reactive ion etching or plasma etching. In one example, the isolation materials may be recessed to a height of about 70 nanometers to about 200 nanometers of a height of fins 106. The upper exposed height of the fin may have a height of about 20 nanometers to about 60 nanometers, and the lower portion of the fin may have a height of about 30 nanometers to about 150 nanometers.

As noted above, dielectric capping layer 200 may include a capping layer for forming a negative charge, and capping layer 400 may include a capping layer for forming a positive charge. Examples of capping layer 200 may include aluminum oxide (Al2O3), titanium dioxide (TiO2), zirconium dioxide (ZrO2), hafnium oxide (HfO2), or magnesium oxide (MgO) over NFET region 103. Example of capping layer 400 may include strontium oxide (SrO), lanthanum oxide (La2O3), lutetium oxide (Lu2O3), yttrium oxide (Y2O3), or germanium oxide (GeO2) disposed over PFET region 105. It will be appreciated that other suitable materials may be employed for the capping layers.

Figure 9:
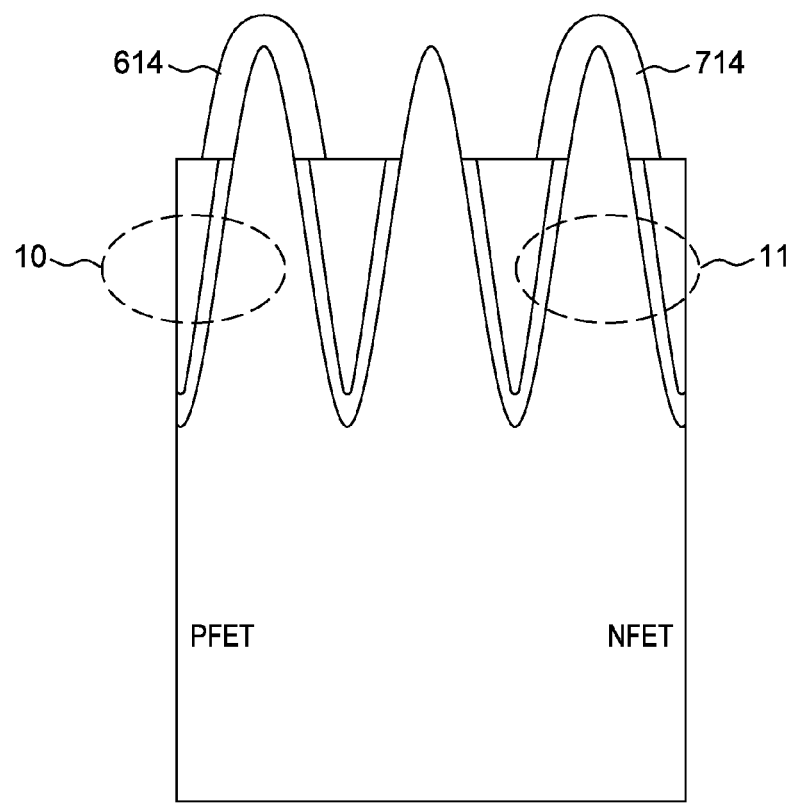
FIG. 9 is a cross-sectional view illustrating a plurality of fins having gates dispose thereon and charge formations for PFETS and NFETS due to the capping layers in accordance with aspects of the present disclosure.
Figure 10:
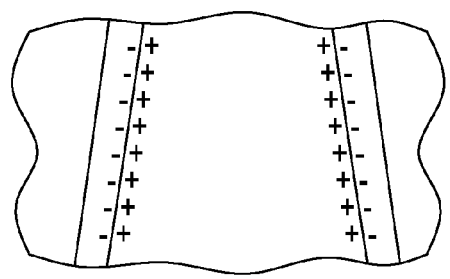
FIG. 10 is an enlarged view of detail 10 in FIG. 9.
Figure 11:
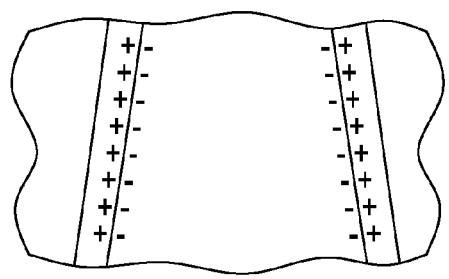
FIG. 11 is an enlarged view of detail 11 in FIG. 9.

FIG. 9 illustrates a portion of the intermediate structure of FIG. 8 having gates 614 and 714 disposed on the exposed portions of the fins. As shown in FIGS. 10 and 11, the interfaces between the capping layers and the lower portions of the fins may result in a charge formation of positive and negative charges. For example, above the PFET region, the fin forming the interface may have a positive charge and the capping layer forming the interface have a negative charge. Above the NFET region, the fin forming the interface may have a negative charge and the capping layer forming the interface have a positive charge.

Figure 12:
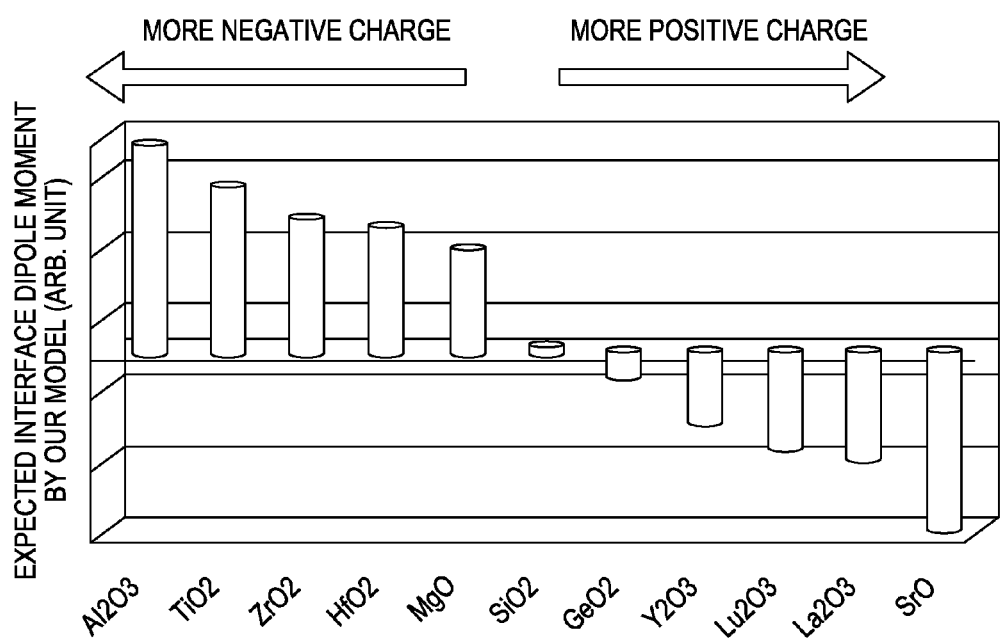
FIG. 12 is a graph illustrating expected interface-dipole moments values for various oxides.

FIG. 12 illustrates the relative expected interface-dipole moments values for various oxides.

Figure 13:
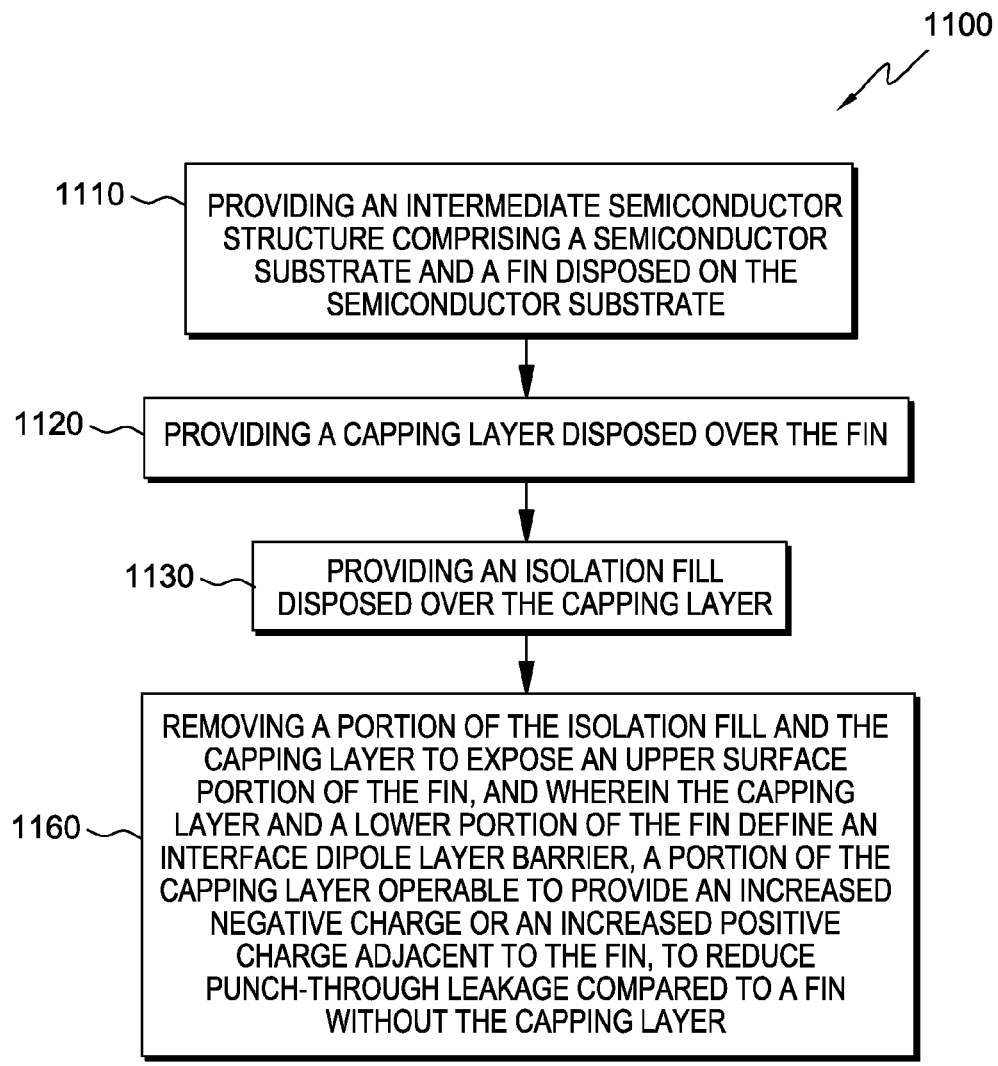
FIG. 13 is a flowchart illustrating one embodiment of a method employing a capping layer treatment of a fin during fabrication of an intermediate semiconductor structure in accordance with aspects of the present disclosure.

FIG. 13 is a flowchart of one embodiment of a method 1100, employing a capping layer treatment of a fin during fabrication of an intermediate semiconductor structure in accordance with aspects of the present disclosure. For example, in this exemplary embodiment, at 1110, an intermediate semiconductor structure is provided having a semiconductor substrate and a fin disposed on the semiconductor substrate. At 1120, a capping layer is disposed over the fin, and at 1130 an isolation fill is disposed over the capping layer. At 1160, portion of the isolation fill and the capping layer is removed to expose an upper surface portion of the fin wherein the capping layer and a lower portion of the fin define an interface dipole layer barrier to reduce punch-through leakage compared to a fin without the capping layer. A portion of the capping layer is operable to provide an increased negative charge or an increased positive charge adjacent to the fin.

Figure 14:
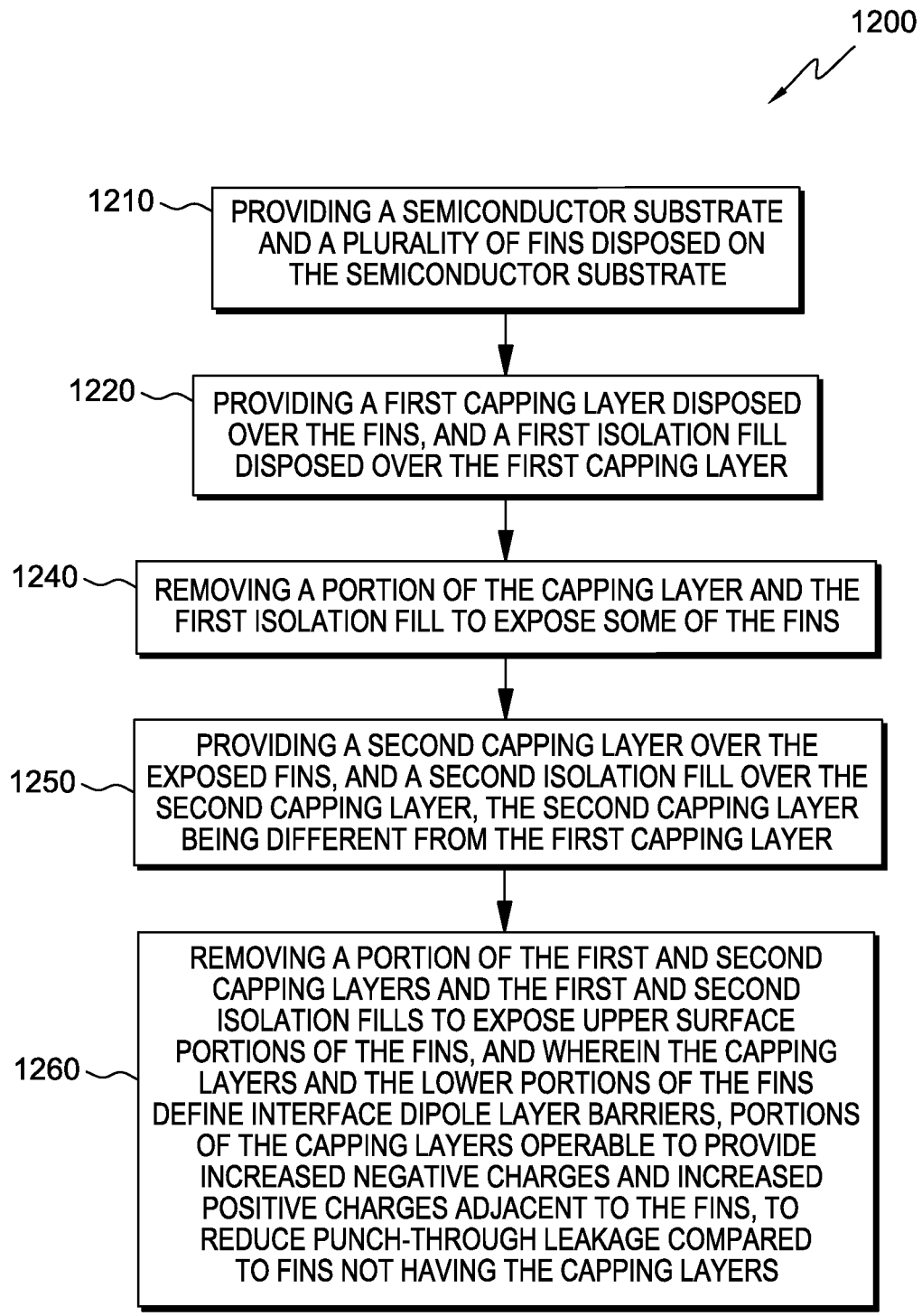
FIG. 14 is a flowchart illustrating another embodiment of a method employing a capping layer treatment of a fin during fabrication of an intermediate semiconductor structure in accordance with aspects of the present disclosure.

FIG. 14 is a flowchart of another embodiment of a method 1200, which may be similar to aspects of the method shown in FIGS. 2-8, employing a capping layer treatment of a fin during fabrication of an intermediate semiconductor structure in accordance with aspects of the present disclosure. For example, in this exemplary embodiment, at 1210, an intermediate semiconductor structure is provided having a semiconductor substrate, a fin disposed on the semiconductor substrate. At 1220, a first capping layer is disposed over the fins, and a first isolation fill is disposed over the first capping layer. At 1240, a portion of the capping layer and the first isolation fill are removed to expose some of the fins. At 1250, a second capping layer is disposed over the exposed fins, and a second isolation fill over the second capping layer. The second capping layer is different from the first capping layer. At 1260, a portion of the first and second capping layers and the first and second isolation fills are removed to expose upper surface portions of the fins. The capping layers and the lower portions of the fins define interface dipole layer barriers. Portions of the capping layers are operable to provide increased negative charges or increased positive charges adjacent to the fins, to reduce punch-through leakage compared to fins not having the capping layers.

Advantages of the present technique may include reducing punch-through leakage. For example, punch-through leakage is a concern for lower leakage. Convention techniques for reducing leakage, such as application of punch-through doping, has drawbacks in that it causes mobility degradation by the dopant in the channel. In addition, fast dopant diffusion from punch-through area to channel is hard to control. The technique of the present invention reduces punch through leakage without degrading mobility. The present technique may be used for Si, SiGe, and pure Ge channels, resulting in no dopant diffusion concern especially with SiGe fins.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method comprising:
   providing an intermediate semiconductor structure comprising:
     a semiconductor substrate;
     a fin disposed on the semiconductor substrate;
   providing a first capping layer disposed over the fin;
   providing first isolation fill disposed over the capping layer;
   removing a portion of the first isolation fill and the first capping layer to expose an upper surface portion of the fin;
   providing a second capping layer disposed over the exposed fin, and a second isolation fill over the second capping layer, the second capping layer being different from the first capping layer;
   removing a portion of the second capping layer and second isolation fill to expose an upper surface of the fin; and
   wherein the capping layers and a lower portion of the fin define an interface dipole layer barrier, a portion of the capping layers operable to provide an increased negative charge or an increased positive charge adjacent to the fin, to reduce punch-through leakage compared to a fin without the capping layers.

2. The method of claim 1 wherein the first capping layer comprises a thickness of about 0.5 nanometers.

3. The method of claim 1 wherein the providing a first capping layer over the fin comprise providing the capping layer using atomic layer deposition or chemical vapor deposition.

4. The method of claim 1 wherein the first capping layer comprises an oxide, and the fin comprise silicon, silicon-germanium, or pure germanium.

5. The method of claim 1 wherein the first capping layer comprises aluminum oxide, titanium dioxide, zirconium dioxide, hafnium oxide, magnesium oxide, strontium oxide, lanthanum oxide, lutetium oxide, yttrium oxide, or germanium oxide.

6. The method of claim 1 wherein the removing a portion of the first isolation fill comprises densification and chemical mechanical planarization.

7. The method of claim 1 further comprising forming a gate disposed over the upper portion of the fin.

8. A method comprising:
   providing a semiconductor substrate and a plurality of fins disposed on the semiconductor substrate;
   providing a first capping layer disposed over the fins, and a first isolation fill disposed over the first capping layer;
   removing a portion of the capping layer and the first isolation fill to expose some of the fins;
   providing a second capping layer disposed over the exposed fins, and a second isolation fill over the second capping layer, the second capping layer being different from the first capping layer;
   removing a portion of the first and second capping layers and the first and second isolation fills to expose upper surface portions of the fins; and
   wherein the capping layers and the lower portions of the fins define interface dipole layer barriers, portions of the capping layers operable to provide increased negative charges or increased positive charges adjacent to the fins, to reduce punch-through leakage compared to fins not having the capping layers.

9. The method of claim 8 wherein the providing the first capping layer comprises providing the first capping layer over the some of the upper portions and the lower portions of the fins disposed over at least one of an NFET region in the substrate and an PFET region in the substrate.

10. The method of claim 9 wherein the providing the second capping layer comprises providing the second capping layer over the other of the upper portions and the lower portions of the fins disposed over the other of at least one of the NFET region in the substrate and the PFET region in the substrate.

11. The method of claim 8 wherein the portion of the first capping layer defining the portion of the dipole layer interface barrier comprises a negative charge or a positive charge, and the portion of the second capping layer defining the portion of the dipole layer interface barrier comprises a positive charge or a negative charge, respectively.

12. The method of claim 8 wherein at least one of the first and second capping layer comprises an oxide.

13. The method of claim 8 wherein at least one of the first and second capping layer comprises strontium oxide, lanthanum oxide, lutetium oxide, yttrium oxide, germanium oxide, and the second capping layer comprises aluminum oxide, titanium dioxide, zirconium dioxide, hafnium oxide, or magnesium oxide.

14. The method of claim 8 further comprising forming a plurality of gates disposed over the upper portions of the fins.

* * * * *